United States Patent [19]

Hoskins et al.

[11] Patent Number: 5,358,877
[45] Date of Patent: Oct. 25, 1994

[54] SOFT PROTON ISOLATION PROCESS FOR AN ACOUSTIC CHARGE TRANSPORT INTEGRATED CIRCUIT

[75] Inventors: Michael J. Hoskins, Mahomet; Martin J. Brophy, Urbana, both of Ill.

[73] Assignee: Electronic Decisions Inc., Urbana, Ill.

[21] Appl. No.: 676,965

[22] Filed: Mar. 29, 1991

[51] Int. Cl.$^5$ .......................................... H01L 21/265
[52] U.S. Cl. ...................................... 437/22; 437/24; 437/62; 437/53; 148/DIG. 84; 148/DIG. 128
[58] Field of Search ...................... 437/22, 24, 26, 62; 148/DIG. 84, DIG. 128

[56] References Cited

U.S. PATENT DOCUMENTS

| | | | |
|---|---|---|---|
| 3,824,133 | 7/1974 | D'Asaro et al. | 437/24 |
| 4,124,826 | 11/1978 | Dixon et al. | 437/24 |
| 4,290,825 | 9/1981 | Dearnaley et al. | 437/24 |
| 4,391,651 | 7/1983 | Yoder | 148/DIG. 84 |
| 4,394,180 | 7/1983 | Dearnaley et al. | 437/24 |
| 4,539,743 | 9/1985 | Anthony et al. | 437/22 |

FOREIGN PATENT DOCUMENTS

| | | | |
|---|---|---|---|
| 259715 | 8/1988 | Fed. Rep. of Germany | 437/26 |
| 270798 | 8/1989 | Fed. Rep. of Germany | 437/26 |

OTHER PUBLICATIONS

Chand et al., "Ion–Implantation and Activation Behavior of Si in MBE–Grown GaAs on Si Substrates for GaAs MESFET's", IEEE Electron Device Letters, May, 19, 1987, pp. 185–187.

Short et al., "Implantation Tailoring of Electrically Active Dopant Profiles in GaAs", Journal Applied Physics, Aug. 1, 1988, pp. 212–221.

Pruniaux et al., "Compensation of N–Type GaAs by Proton Bombardment", Proceedings Second Int'l Conference of Ion Implantation in Semiconductors, New York, 1971.

Foyt, A. "Isolation of Junction . . . Bombardment", Solid State Electronics, vol. 12, pp. 209–214, 1969.

Zavada, J., et al, "Hydrogen Depth Profiles . . . N–Type GaAs", J. Appl. Phys. 58(10), Nov. 1985, pp. 3731–3734.

Zavada, J. et al, "Depth Distributions . . . N–Type GaAs", J. Appl. Phys. 57(6), Mar. 1985, pp. 2299–2301.

Wilson, R., et al, "Proton, Deuteron, and Helium Implantation . . . Fabrication", J. Appl. Phys. 57(11), Jun. 1985, pp. 5006–5010.

Blood, P. "Carrier Removal in Dauterium Irradiated GaAs", The Institute of Physics Conf. Sec. No. 56(5), 1980, pp. 251–258.

Signon, F., et al, "Hot Electron Studies . . . 2.8 MeV Protons", Int. Conf. on Ion Implanation in Semiconductors May 4–7, 1970.

*Primary Examiner*—Olik Chaudhuri
*Assistant Examiner*—G. Fourson
*Attorney, Agent, or Firm*—Shlesinger, Arkwright & Garvey

[57] ABSTRACT

A method for electrically isolating an integrated circuit element in an acoustic charge transport device comprises the steps of providing a semi-insulating substrate; providing an epitaxial layer with a thickness and carrier concentration appropriate for an ACT device; providing a circuit element semiconductor layer in the epitaxial layer for construction of an integrated circuit element, the layer having a thickness substantially less than the thickness of the epitaxial layer and having a carrier concentration substantially greater than the ACT epitaxial layer; laterally isolating the semiconductor layer from other regions of the ACT epitaxial layer; and bombarding the semiconductor layer with protons at a dose sufficient to provide significant vertical electrical isolation from underlying regions of the epitaxial layer semi-insulating with minimal detrimental effect on the electrical characteristics of the semiconductor layer.

10 Claims, 4 Drawing Sheets

SOFT PROTON ISOLATION PROCESS FOR AN ACOUSTIC CHARGE TRANSPORT INTEGRATED CIRCUIT

FIELD OF THE INVENTION

This invention was made with Government support under contract number F-30602-85-C-0170 awarded by the Department of Defense. The Government has certain rights in this invention.

The present invention is directed towards a general method for monolithically integrating gallium arsenide (GaAs) circuit elements with an Acoustic Charge Transport (ACT) device.

The present invention is related to copending application Ser. No. 676,967 entitled "Acoustic Charge Transport Integrated Circuit Process," filed on Mar. 29, 1991, still pending whose disclosure is hereby incorporated.

BACKGROUND OF THE INVENTION

The acoustic charge transport (ACT) device, described in U.S. Pat. No. 4,633,285, is a high speed GaAs charge transfer device in which electron transport is accomplished using the traveling wave electric field of a UHF surface acoustic wave generated directly in the GaAs. The capability to monolithically integrate conventional active and passive GaAs integrated circuit elements with the ACT device is absolutely critical in advanced applications of the ACT technology. Most advanced ACT device applications, such as programmable ACT signal processors or high performance delay lines and transversal filters, require significant levels of conventional digital and/or analog circuit integration with the ACT device.

A variety of conventional GaAs integrated circuit (IC) methods have been developed and are well known in the art. The most common of these utilizes selective ion implantation in semi-insulating GaAs substrates to spatially define and electrically isolate the semiconducting regions required for individual IC elements. Another common approach involves the epitaxial growth of thin GaAs layers on the semi-insulating substrate coupled with mesa etching or ion bombardment damage techniques to achieve spatial definition and lateral electrical isolation of individual circuit element semiconducting layers. In most cases, the semiconducting regions required for the IC elements are very thin and approximately the same for all elements, thus simplifying the integration process.

In contrast with the conventional GaAs IC technology, the integration of high performance GaAs circuit elements such as Schottky barrier field effect transistors, diodes, and semiconductor resistors with the ACT device presents a significant challenge. This difficulty arises because the semiconductor layer characteristics required to achieve acceptable operation of the ACT device are considerably different from those required to produce acceptable integrated circuit elements. The ACT device channel layer must presently be grown epitaxially to achieve the very high purity required for precision charge transfer and it is relatively thick (typically a few microns) with relatively low n-type carrier concentration (typically $10^{15}$–$10^{16} cm^3$) in an optimal design. In comparison, the desired semiconductor layer thickness for active integrated elements, for example an FET, is relatively thin (typically less than a few thousand angstroms) with high n-type or p-type carrier concentration (of the order of $2 \times 10^{17}/cm^3$). Moreover, ion implantation of the dopant is usually preferred in a manufacturable process to take advantage of the superior parameter control and spatial uniformity associated with this approach.

Although a thin, highly doped GaAs layer can be formed at the surface of the ACT layer by conventional ion implantation or epitaxial growth techniques, a fundamental integration difficulty involves the vertical electrical isolation of the layer from the underlying epitaxial material. For example, without vertical isolation, the epitaxial material essentially forms a large vertical extension to the n-channel of a Schottky barrier FET resulting in excessive FET pinch-off voltages and high parasitic shunt conductance between the source and drain terminals of the FET. These effects prohibit the proper operation of the FET. In general, the DC or AC parasitic effects associated with a conductive epitaxial buried layer inhibit or greatly degrade the operation of high speed GaAs integrated circuit elements. These parasitic effects are particularly critical in an ACT integrated circuit because the characteristic impedance levels of the ACT device and its appropriate interface circuits are very high.

A prior ACT integration approach for the FET, which attempts to address the vertical isolation problem, utilizes a p-type implant into the ACT layer to form a shallow p-type tub in which an n-type FET channel is situated. Under proper conditions, this configuration can provide the necessary pinchoff voltage isolation through the potential barrier associated with the zero or reversed biased p-n junction but it also produces an undesirable fundamental tradeoff between two key performance parameters of the FET. In particular, it is found that the low p-layer acceptor sheet carrier concentration regime (corresponding to nearly complete p-layer thermal depletion via its adjacent pn junctions) produces a DC punch-through effect at unacceptably low drain-source voltages which effectively destroys the intended vertical isolation from the underlying epitaxial layer. Alternatively, the large acceptor sheet carrier concentration regime (which eliminates the punch-through problem by expanding the drain-source punch-through voltage to levels beyond the intended operating range of the FET) produces an unacceptably large value of AC drain-source conductance due to the capacitive coupling of the FET channel to the underlying conductive p-layer. Because the degrading effects of these regimes tend to overlap, no p-tub structure design which provides an acceptable compromise to these competing effects has been found. In addition, since this approach results in p-type or n-type conductive buried layers under other integrated circuit elements as well, general circuit element performance is degraded by parasitic effects.

Short et al. investigated the use of O and He compensation implants for tailoring the doping profiles associated with implanted layers in semi-insulating GaAs substrates.

Chand et al. have described a process which provides a minimal level of DC vertical electrical isolation for an implanted FET in an undoped GaAs epitaxial buffer layer. This process utilizes a relatively low dose oxygen compensating implant in the active region of the FET to create a thin (several thousand angsttoms) semi-insulating layer beneath the implanted channel layer of the FET. It was found that the oxygen implant created undesirable damage of the FET channel layer and a high temperature anneal at 500° C. was required to mitigate this effect. It was also reported that the degree of electrical isolation achieved with this process was inferior to that associated with implanted semi-insulating substrate technology despite the relatively low conductivity of the undoped buffer layer. This prior epitaxial implant process cannot be successfully used for ACT compatible circuit element integration because the penetration depths of the compensating ions are roughly an order of magnitude less than that required for effective vertical isolation of the thick conductive ACT epitaxial layer. Although a thin semi-insulating vertical isolation layer can be produced by this process, circuit element structures isolated by this technique are susceptible to the same DC punch-through and AC parasitic effects described for the p-tub approach due to the presence of the underlying epitaxial layer.

The use of proton implants for lateral electrical isolation of integrated circuit components in the monolithic plane of semiconductor substrates is well known. It is generally understood that the electrical isolation is obtained from the carrier compensation effects of energy states deep in the band gap (deep traps) resulting from the crystal damage associated with the particle bombardment. The typical application of this technique involves the selective implant of protons in all regions of the integrated circuit which are not occupied by semiconductor based circuit elements.

The use of ion implantation for device isolation is well established in microcircuit fabrication technology. There, an energetic implant is done to create fully isolated layers, between devices for example. Lateral isolation is the object of that process, which has been widely reported in the scientific literature.

Another type of FET using implant isolation is described in a report by Pruniaux et al (Proc. 2nd International Conf. on Ion Implantation in Semiconductors, Springer Verlag, N.Y., 1971). In this implementation, a thin insulating region is produced with a low energy proton implant between the FET's gate and its active channel. This work appears to have little relevance to the disclosed invention.

Other reports have used hydrogen for FET fabrication, but in a chemical, donor neutralizing fashion as opposed to making use of the crystal damage associated with bombardment with high energy protons. The donor neutralization technique is not known to provide depth selectivity.

OBJECTS AND SUMMARY OF THE INVENTION

The object of the present invention is to provide an ACT integrated circuit method that provides complete vertical, as well as lateral, electrical isolation of integrated circuit elements in the thick conductive epitaxial layer required for ACT device construction.

The present invention is directed towards a general method for monolithically integrating GaAs circuit elements with an ACT device. The method supports the integration of a variety of circuit elements which require relatively thin GaAs semiconductor layers with high carrier concentration, and which would otherwise be incompatible with the relatively thick epitaxial layer of low carrier concentration required for ACT device operation. These circuit elements include Schottky barrier and p-n junction FETs, Schottky barrier and p-n diodes, and n-type or p-type semiconductor resistors.

IN accordance with the method, a GaAs epitaxial layer with a thickness and carrier concentration appropriate for an ACT device is grown on a GaAs semi-insulating substrate. Masked ion implantation of n-type and p-type dopant impurities and subsequent high temperature implant activation annealing is performed to realize thin semiconductor regions, at the surface of the ACT epitaxial layer, with thickness and carrier concentration appropriate for the associated integrated circuit elements. A masked high energy proton implantation at relatively large dose (referred to as hard proton isolation) is performed to remove the conductivity of the entire epitaxial layer except in the regions associated with the intended circuit elements and ACT device transport channel in order to achieve lateral electrical isolation of these elements. Ohmic and Schottky barrier contacts are constructed to realize the surface structure features of the circuit elements and the ACT device. A masked high energy proton implantation at a dose optimized to provide significant vertical selectivity to the isolation (referred to as soft proton isolation) is performed in the circuit element semiconductor regions to render the entire underlying ACT epitaxial layer portions semi-insulating with minimal detrimental effect on the electrical characteristics of the circuit elements.

A variation of the method employs a deuteron soft isolation.

Another variation of the method utilizes relatively thin GaAs layers grown by epitaxy on top of the ACT epitaxial layer to implement the semiconductor regions for the integrated circuit elements.

This vertically selective soft proton isolation method results in the monolithic integration of GaAs circuit elements with the ACT device with complete vertical, as well as lateral, electrical isolation. The elmination of the conductivity of the underlying ACT epitaxial layer eliminates the unique parasitic effects which would otherwise be associated with an ACT-device-compatible integration process, thus permitting the realization of integrated circuit element performance similiar to that obtained with conventional implanted semi-insulating substrate technology. The soft proton isolation method also permits independent optimization of the semiconductor layer properties of the integrated circuit elements and the ACT device. The integration method enables the manufacturing of large scale, high performance ACT integrated circuits which realize complex and powerful signal processing functions.

These and other objects of the present invention will become apparent from the following detailed description.

BRIEF DESCRIPTIONS OF THE DRAWINGS

DETAILED DESCRIPTION OF THE INVENTION

Figure 1:
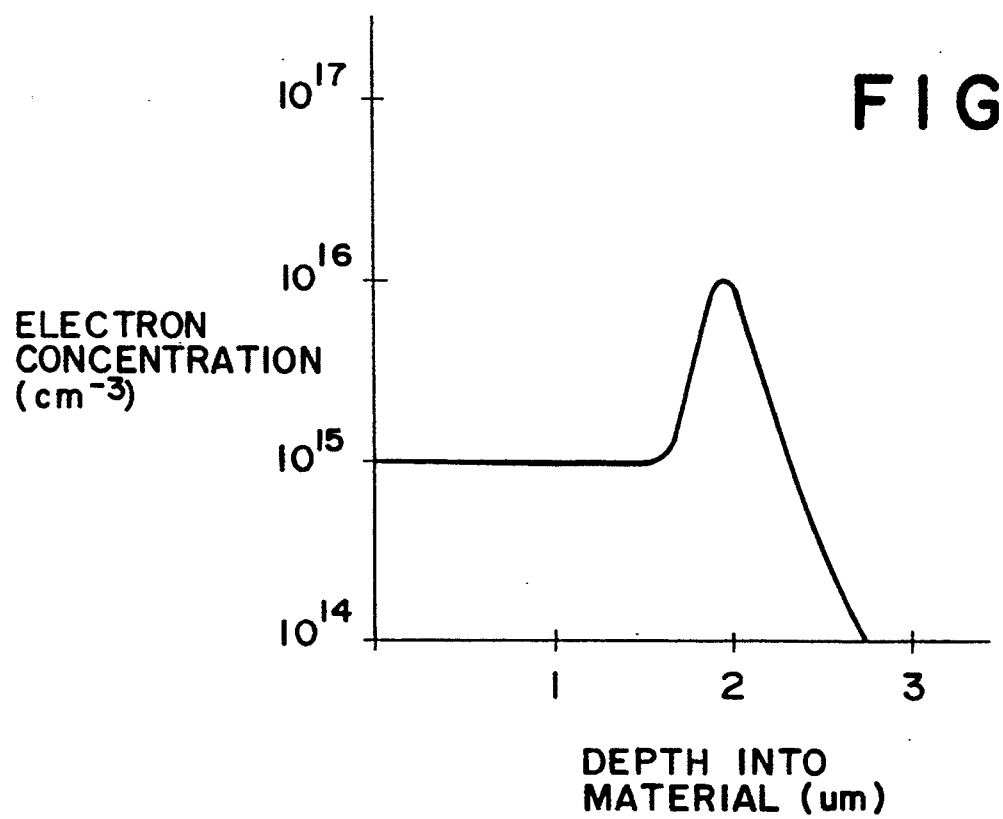
FIG. 1 shows a plot of the electron concentration versus depth for a typical ACT epitaxial layer designed for operation with a 360 MHz frequency, 8 $\mu$m wavelength SAW.

As disclosed in U.S. Pat. No. 4,633,285, and other publications related to ACT technology, the semiconductor material used for ACT device construction is typically produced through the growth of a GaAs epitaxial layer on a semi-insulating GaAs support substrate. The charge transport performance of the ACT device is optimized when the thickness of the epitaxial channel layer is roughly one half of the wavelength associated with the surface acoustic wave (SAW) which powers the charge transport in the device. For typical ACT device SAW frequencies in the range of 300 MHz to 1000 MHz, the epitaxial layer thicknesses are of the order of a few microns. FIG. 1 shows the carrier concentration profile for a typical ACT epitaxial layer designed for operation at 360 MHz SAW frequency and 8 μm SAW wavelength. In practice, the carrier concentration profile is often graded, as shown in FIG. 1, to provide enhanced charge transfer performance at the desired transport depth. When the device is biased such that transport occurs in the carrier depleted channel at the depth associated with the peak level of the carrier concentration profile, the charge packet is compressed with very small cross section by the depletion fields, resulting in great immunity to transfer inefficiency induced by impurity centers. This epitaxial structure therefore provides excellent and repeatable ACT device charge transfer performance with high levels of charge transfer efficiency. However, conventional GaAs integrated circuit methods cannot be used to directly realize useful auxiliary circuit elements in this epitaxial layer because the low carrier concentration and relatively thick layer are incompatible with the high carrier concentration and thin layer requirements of typical elements. In addition, the epitaxial layer is a poor support substrate for additional semiconductor layers which have the appropriate characteristics for circuit elements because the electrical conductivity of this layer inhibits electrical isolation and creates undesired parasitic DC and AC current paths.

Figure 2:
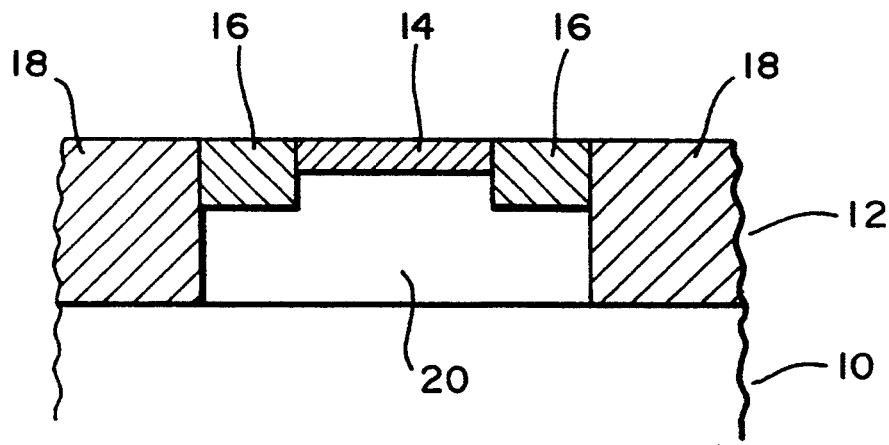
FIG. 2 is a cross-sectional view of a portion of the ACT epitaxial layer incorporating dopant implanted regions and hard proton isolated regions to define an area for FET construction.
Figure 3:
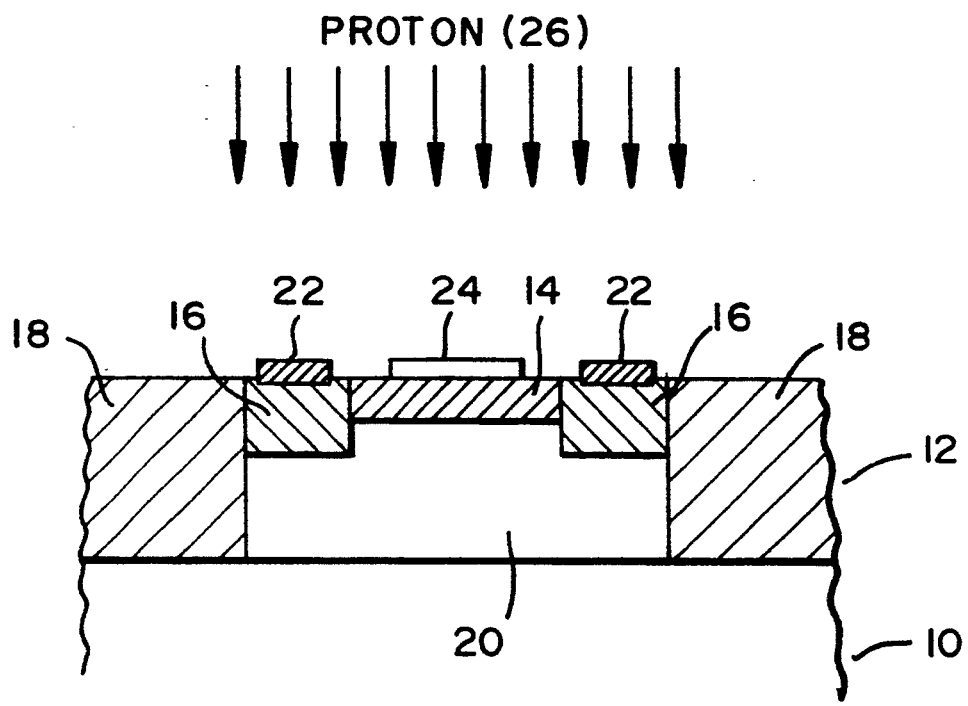
FIG. 3 is a cross-sectional view of a portion of the ACT epitaxial layer representing an intermediate result of continued FET construction on the semiconductor layer structure of FIG. 2.
Figure 4:
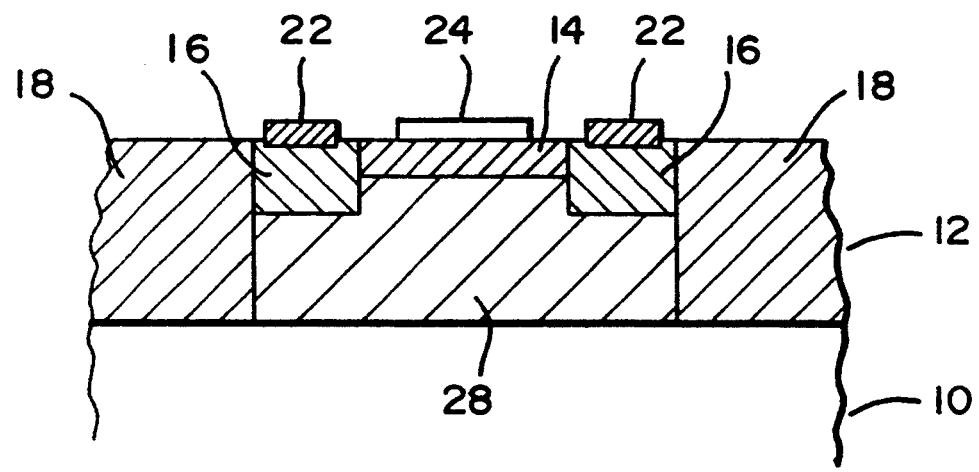
FIG. 4 is a cross-sectional view of a portion of the ACT epitaxial layer incorporating a fully integrated Schottky barrier gate FET with complete lateral and vertical electrical isolation according to the method of the invention.

FIGS. 2, 3, and 4 illustrate cross-sections of a portion of the ACT epitaxial layer where the method of the present invention is used to achieve the monolithic integration of a GaAs Schottky barrier FET with complete vertical and lateral electical isolation. Although these figures focus on the integrated circuit element in the ACT epitaxial layer, it is understood that an ACT device (not shown) can be fabricated elsewhere in the epitaxial layer using a subset of the processes illustrated.

Referring to FIG. 2, an epitaxial GaAs layer optimized for construction of the ACT device, is grown on a semi-insulating GaAs support substrate 10. Selectively masked ion implantation of an n-type GaAs dopant, for example Si, is used to form a thin n-type GaAs layer 14 near the surface of the epitaxial layer 12 with thickness and carrier concentration appropriate for an FET channel. Masked dopant implantation is also used to create very highly doped n+ regions 16 compatible with low resistance ohmic contact formation. In practice, all required dopant implantations are performed first and then a high temperature anneal is used to provide electrical activation of the dopant impurities resulting in semiconductor layers 14 and 16 with the desired carrier concentrations. Typical thicknesses of the layers 14 and 16 are of the order of a few thousand angsttoms with peak carrier concentrations of the order of $2 \times 10^{17}$ or greater.

After a high temperature implant activation anneal, all regions of the epitaxial layer 12, except for those regions associated with the intended FET and ACT channel, are bombarded with high energy protons at relatively large dose to remove the conductivity of the ACT epitaxial layer and provide lateral electrical isolation regions 18. This proton bombardment, referred to as hard proton isolation, provides lateral electrical isolation between the ACT channel and the FET but does not remove the conductivity of the portion of the epitaxial layer 20 underlying the FET layers 14 and 16. The implantation energy and dose associated with the hard proton isolation are tailored to the characteristics of the specific ACT epitaxial layer design. Typical parameters appropriate for the epitaxial carrier concentration characteristic shown in FIG. 1 are a proton energy of 300 KeV and a proton dose of $10^{14}/cm^2$.

Referring to FIG. 3, which represents an intermediate result of continued FET fabrication on the semiconductor layer structure of FIG. 2, ohmic contacts 22 are constructed on the n+ layer regions 16 and subsequently annealed to form a composite high conductivity electrical path to the FET channel layer 14. A Schottky barrier metal gate 24 is constructed on the FET channel layer 14 to complete the surface structure of the FET. Although not shown in FIG. 3, a variation of this structure can include a thin insulating film of passivation dielectric over the entire FET element surface. The FET element region is subsequently bombarded by high energy protons 26 at an energy and relatively low dose specifically tailored to provide significant depth dependence to the resulting carrier removal effect. In order to achieve the desired result, the proton bombardment 26 must be executed with a relatively precise low dose which falls in a narrow operational window. In contrast with the conventional hard proton isolation, which is performed in regions surrounding the FET, this bombardment is performed in the active area of the FET. Because of these distinctions the proton bombardment 26 is referred to as soft proton isolation. The soft proton isolation is masked such that proton bombardment does not occur in the region of the epitaxial layer occupied by the ACT device, but it may be performed in the hard proton isolated regions 18 without detrimental effect.

FIG. 4 shows the final result of the soft proton isolation on the structure of FIG. 3. With the proper energy and dose, the soft proton isolation eliminates the conductivity of the portion of the epitaxial layer underlying the FET layers 14 and 16 with minimal detrimental effect on the electrical characteristics of these layers. A semi-insulating region 28 is produced under the FET structure with electrical insulation properties comparable to those associated with the hard proton isolated regions 18 and the semi-insulating substrate 10. The electrical characteristics of the isolated FET (IFET) produced by this method are very similiar to those obtained from a Schottky barrier gate FET produced by the conventional method of direct dopant implantation into a semi-insulating GaAs substrate.

Figure 5:
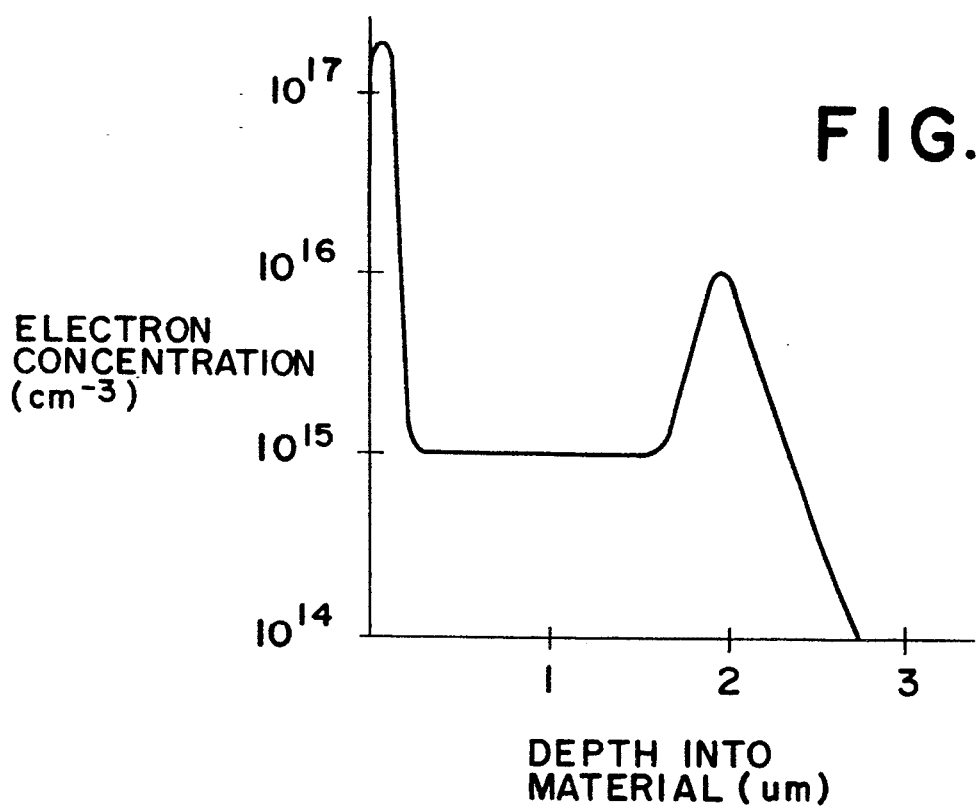
FIG. 5 shows a plot of the electron concentration versus depth along a vertical cross section through the dopant implanted epitaxial structure of FIG. 2.
Figure 6:
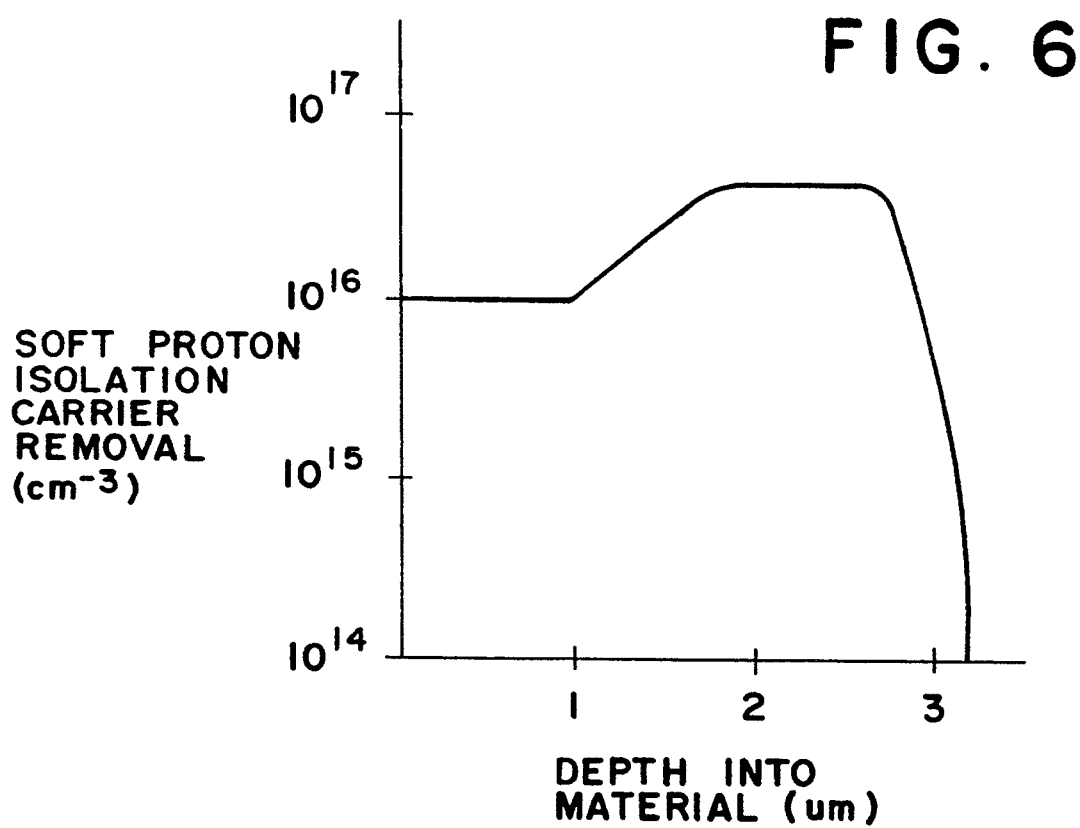
FIG. 6 shows a plot of the carrier removal characteristic versus depth for a soft proton isolation of the FIG. 4 structure with 300 KeV proton energy and $1 \times 10^{12}/cm^2$ dose.
Figure 7:
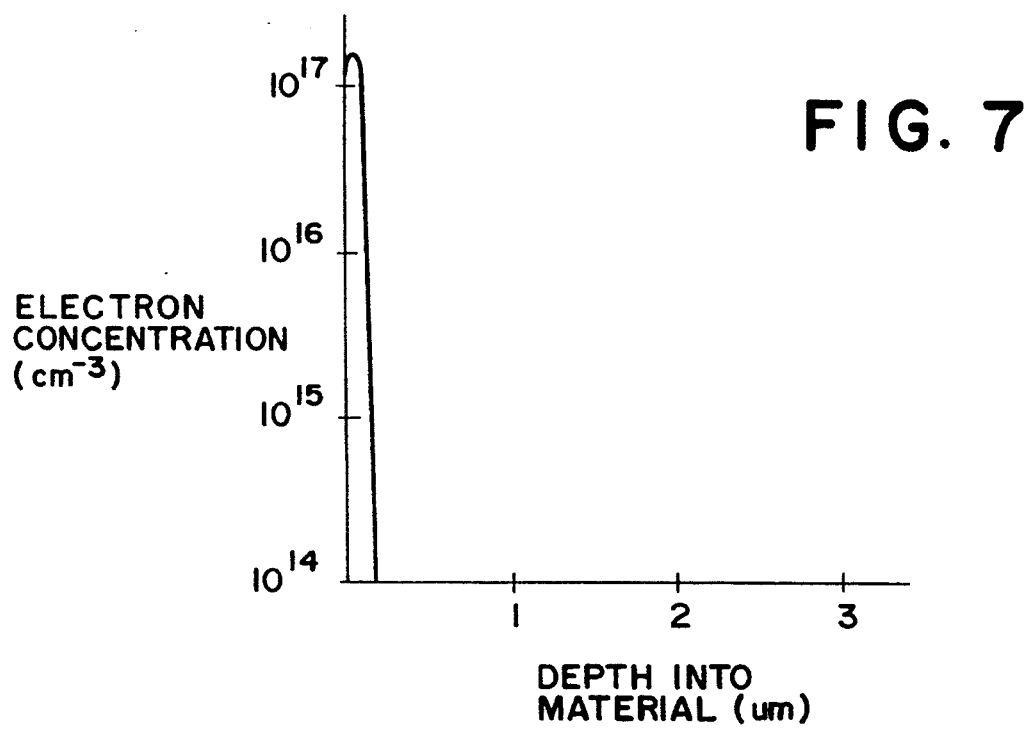
FIG. 7 shows a plot of the electron concentration versus depth along a vertical cross-section through the implanted FET channel layer and the soft isolated epitaxial layer of the FIG. 4 structure.

The mechanism of the soft proton isolation, which eliminates the conductivity of the underlying epitaxial layer while essentially retaining the electrical characteristics of the IFET channel layer, can be understood by considering the electron carrier concentration depth profile of the implanted epitaxial layer and the depth dependent carrier removal characteristics of the low dose proton isolation. FIG. 5 illustrates the typical variation of electron concentration with depth into the material for a vertical cross-section through the n-type FET channel layer 14 and the epitaxial layer 20 of the FIG. 2, structure. The peak carrier concentration in the FET channel layer is typically more than an order of magnitude greater than the ACT epitaxial layer carrier concontration. FIG. 6 shows the typical GaAs carrier removal characteristic as a function of depth for proton bombardment at the energy of 300 KeV and the relatively low dose of $1 \times 10^{12}/cm^2$ typically used for soft isolation of the FIG. 3 structure. The carrier removal rate is constant near the surface but it is enhanced by approximately a factor of 3-5 at depths in the vicinity of the proton range associated with the 300 KeV energy (roughly 3 $\mu$m). During soft proton isolation, the electron concentration characteristic of FIG. 5 is modified by the carrier removal characteristic of FIG. 6. FIG. 7 illustrates the resulting electron concentration profile for a vertical cross-section through the n-type FET channel layer 14 and the isolated epitaxial layer 28 of the FIG. 4 structure. The electron concentration in the portion of the epitaxial layer beneath the FET channel layer is essentially eliminated where the soft proton isolation carrier removal exceeds the electron concentration. However, since the carrier removal near the surface is a small fraction of the total FET layer carrier concentration, this layer is substantially unperturbed by the proton bombardment.

Hence, at the appropriate proton dose, the depth dependence of the carrier removal and the large difference in carrier concentration between the surface layer and the epitaxial layer can be used to advantage to achieve electrical isolation with a high degree of effective vertical selectivity. The appropriate soft isolation dose window is bounded on the low end by the dose which just barely compensates the epitaxial layer doping. An upper bound on the dose window is set by the maximum level of FET channel layer carrier compensation considered to be tolerable. In general, the appropriate soft proton isolation dose is determined by consideration of the carrier concentration in the epitaxial layer and the FET channel layer, and the desired FET pinchoff voltage. For the typical carrier concentration parameters described here, it is found that complete vertical isolation of the FET layer with negligible degradation of its electrical characteristics can be obtained for soft proton isolation doses in the approximate range of $6 \times 10^{11}/cm^2$ to $3 \times 10^{12}/cm^2$. It is preferable that the energy of the proton bombardment be sufficiently high that the proton penetration depth roughly equals or exceeds the epitaxial layer thickness to insure complete vertical isolation. This requires an energy/thickness ratio of approximately 100 KeV/$\mu$m.

The damage annealing characteristics of proton bombarded GaAs have been investigated previously. It is known that high dose proton bombardment lattice damage in GaAs may be annealed at sufficiently high temperatures, usually in excess of 500° C. However, we have found that a low temperature anneal after the soft proton isolation of circuit elements provides enhanced thermal stability of the resulting devices. Typical stabilization anneal parameters are 2 hours at 200°-250° 1 C.

Figure 8:
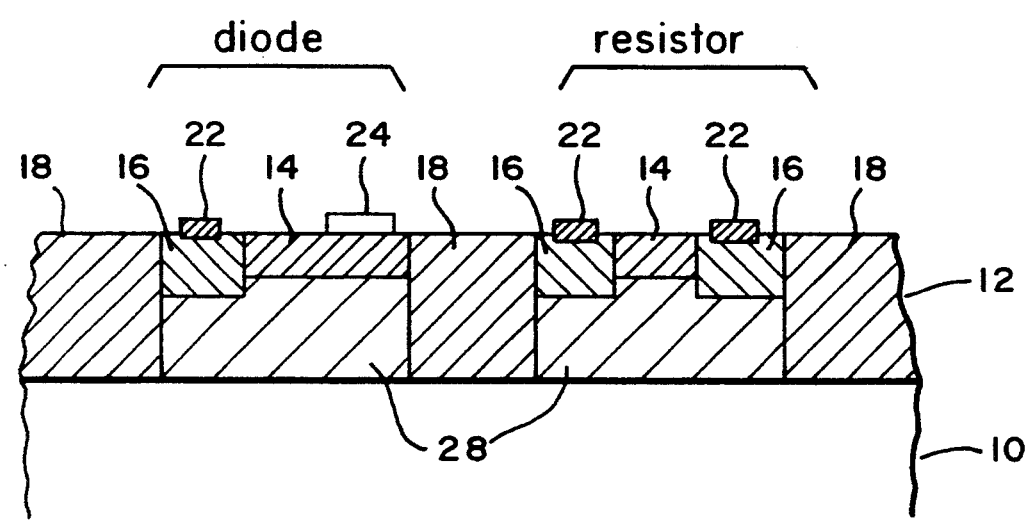
FIG. 8 illustrates a cross-section of a portion of the ACT epitaxial layer where the method of the invention is used to achieve the monolithic integration of a Schottky barrier diode and a semiconductor layer resistor with complete vertical and lateral electical isolation.

Although the soft proton isolation integrated circuit method has been illustrated here for a Schottky barrier gate FET, the method is generally applicable to any integrated elements which utilize relatively thin semiconductor layers with a carrier concentration that is substantially greater than the ACT epitaxial layer. FIG. 8 illustrates the cross-section of a portion of the ACT epitaxial layer where the method of the invention is used to achieve the monolithic integration of a Schottky barrier diode and a semiconductor layer resistor with complete vertical and lateral electical isolation. The key features of these structures are similiar to those discussed in connection with FIGS. 3-6. A Schottky barrier diode consists of an implanted n-type layer 14, implanted n+ contact layer 16, ohmic contact 22, and Schottky barrier metal electrode 24. A semiconductor layer resistor consists of implanted n-type layer 14, implanted n+ contact layers 16, and ohmic contacts 22. Lateral electrical channel definition and isolation for the diode and resistor are provided by hard proton isolated regions 18. Vertical electrical definition and isolation of the diode and resistor are provided by soft proton isolated regions 28. Circuit elements with differing properties can also be obtained by utilizing p-type implants for the channel layers 14 and the contact layers 16. Structures utilizing combinations of thin p-type and n-type layers can also be integrated to form useful structures such as bipolar transistors and p-n diodes.

The method of the invention permits independent optimization of the ACT and integrated circuit element semiconductor layer properties and eliminates all undesirable parasitic effects in circuit elements which would otherwise be associated with ACT integration. Therefore, very high performance ACT devices and related interface circuits can be constructed monolithically in the same chip. The invention enables the reliable integration of very large numbers of circuit elements with one or more ACT devices. These capabilities permit the construction of a variety of complex high speed ACT integrated circuits which realize powerful signal processing functions.

Although dopant ion implantation has been described as a preferred approach for realizing the thin semiconductor layers used for integrated circuit elements near the surface of the ACT epitaxial layer, epitaxial growth of thin doped surface layers is also possible. Depending on the specific layer configuration, etch removal of these doped surface layers in the region of the integrated circuit occupied by the ACT device may be required for proper ACT device operation. Shallow electrical isolation implants with relatively heavy ions such as oxygen may also be used to render the doped surface layers semi-insulating in the region of the integrated circuit occupied by the ACT device thus permitting unperturbed ACT device operation.

Although hard proton isolation is a preferred approach for providing lateral electrical isolation between circuit elements, removal of the epitaxial layer between circuit elements by masked chemical etching can also be used.

Another variant of the method utilizes deuteron bombardment for hard and/or soft electrical isolation. Deuterons have penetration depth characteristics in GaAs similiar to protons and they can be used to achieve effective soft isolation vertical selectivity at energies and doses similiar to those described for protons.

The present invention provides a general method for integrating active and passive semiconductor circuit elements with Acoustic Charge Transport (ACT) devices. A soft proton isolation method enables the integration of high performance circuit elements which utilize thin layers of high carrier concentration in the thick GaAs epitaxial layers required for acoustic charge transport (ACT) device construction. GaAs integrated circuit elements such as field effect transistors, diodes, and resistors are constructed in thin, highly doped GaAs layers near the surface of the thick ACT epitaxial layer using a unique, vertically selective, soft proton isolation process which eliminates the conductivity of the underlying thick epitaxial layer with minimal perturbation of the integrated element layer conductivity and carrier concentration.

This soft isolation method represents a significant advancement in ACT compatible integrated circuit technology because it eliminates the operating characteristic and performance limitations induced by the parasitic capacitive and resistive elements associated with the buried conductive layers of prior GaAs epitaxial integration methods.

The key features of this ACT integrated circuit method are the following:

A GaAs epitaxial layer appropriate for ACT device construction.

One or more GaAs semiconductor layers at the surface of the ACT epitaxial layer which are appropriate for integrated circuit element construction and which have a composite thickness substantially less than the ACT epitaxial layer and which have a carrier concentration substantially greater than the ACT epitaxial layer.

Proton isolation of regions not occupied by the intended ACT device or circuit element semiconductor layers to produce lateral electrical isolation in the monolithic plane.

Proton isolation of regions occupied by the circuit element semiconductor layers to remove the conductivity of the underlying epitaxial layer while substantially unaffecting the electrical characteristics of the circuit element layers, thus producing electrical isolation of the circuit element semiconductor layer from the underlying epitaxial layer.

In the past, proton bombardment has been primarily used in regions of the chip, which are not occupied by devices or circuit elements, for lateral electrical isolation between devices in the monolithic plane. Since proton isolation creates semiconductor crystal damage, a person skilled in the art would not normally consider it useful, or even possible, to utilize this process in the active region of a device. The primary feature of this invention is that proton bombardment of the active region of an integrated circuit element is used to selectively remove the conductivity of an underlying semiconductor layer while substantially unaffecting the circuit element. This method is used to achieve integration of a variety of circuit elements in the conductive ACT epitaxial layer in such a way that the ACT epitaxial layer is electrically transparent to the operation of the circuit elements.

While this invention has been described as having preferred design, it is understood that it is capable of further modification, uses and/or adaptations of the invention following in general the principle of the invention and including such departures from the present disclosure as come within known or customary practice in the art to which the invention pertains and as may be applied to the essential features set forth and fall within the scope of the invention or the limits of the appended claims.

We claim:

1. A method for electrically isolating an integrated circuit element in an acoustic charge transport device, said method comprising the steps of:
    a) providing a semi-insulating substrate;
    b) providing an epitaxial layer on the semi-insulating substrate with a thickness and carrier concentration appropriate for an ACT device;
    c) providing a circuit element semiconductor layer in the epitaxial layer for construction of an integrated circuit element, the layer having a thickness substantially less than the thickness of the epitaxial layer and having a carrier concentration substantially greater than the ACT epitaxial layer;
    d) laterally isolating the semiconductor layer from other regions of the ACT epitaxial layer; and
    e) bombarding the semiconductor layer with protons or deuterons at a dose and energy sufficient to provide significant vertical electrical isolation from underlying regions of the epitaxial layer semi-insulating with minimal detrimental effect on the electrical characteristics of the semiconductor layer.

2. A method as in claim 1, and wherein:
    a) said bombarding is performed with deuteron.

3. A method as in claim 1, and including the step of:
    a) selecting the energy of the protons such that the penetration depth at least substantially equals the epitaxial layer thickness to insure complete vertical electrical isolation.

4. A method as in claim 3, wherein:
    a) said providing a semi-insulating substrate is implemented with gallium arsenide; and
    b) the energy of the bombarding is substantially at 100 KeV/$\mu$m thickness of the epitaxial layer.

5. A method as in claim 3, wherein:
    a) said providing a semi-insulating substrate is implemented with gallium arsenide; and
    b) the dose of the protons is substantially in the approximate range of $6 \times 10^{11}/cm^2$ to $3 \times 10^{12}/cm^2$.

6. A method as in claim 3, and including the step of:
    a) annealing after said bombarding at a low temperature.

7. A method as in claim 6, wherein:
    a) said providing a semi-insulating substrate is implemented with gallium arsenide; and
    b) said annealing is implemented substantially for 2 hours at 200°-250° C.

8. A method as in claim 1, wherein:
    a) said laterally isolating is performed with masked ion implantation at relatively large dose.

9. A method as in claim 8, wherein:
    a) said laterally isolating is performed with protons.

10. A method as in claim 9, wherein:
    a) said laterally isolating is performed with deuteron.

* * * * *